(12) United States Patent
Pütter et al.

(10) Patent No.: US 10,794,964 B2
(45) Date of Patent: Oct. 6, 2020

(54) DEVICE AND METHOD FOR DETERMINING A PARAMETER OF A TRANSFORMER

(71) Applicant: OMICRON ELECTRONICS GMBH, Klaus (AT)

(72) Inventors: Markus Pütter, Sulz (AT); Bernd Marte, Klaus (AT)

(73) Assignee: OMICRON ELECTRONICS GMBH, Klaus (AT)

( * ) Notice: Subject to any disclaimer, the term of this patent is extended or adjusted under 35 U.S.C. 154(b) by 0 days.

(21) Appl. No.: 15/548,950

(22) PCT Filed: Jan. 26, 2016

(86) PCT No.: PCT/EP2016/051544
§ 371 (c)(1),
(2) Date: Aug. 4, 2017

(87) PCT Pub. No.: WO2016/124443
PCT Pub. Date: Aug. 11, 2016

(65) Prior Publication Data
US 2018/0024180 A1    Jan. 25, 2018

(30) Foreign Application Priority Data
Feb. 6, 2015   (AT) .............................. A 50092/2015

(51) Int. Cl.
*G01R 31/62*    (2020.01)
*G01R 27/26*    (2006.01)
*G01R 29/20*    (2006.01)

(52) U.S. Cl.
CPC .......... *G01R 31/62* (2020.01); *G01R 27/2611* (2013.01); *G01R 29/20* (2013.01)

(58) Field of Classification Search
CPC ... G01R 31/027; G01R 27/2611; G01R 29/20
(Continued)

(56) References Cited

U.S. PATENT DOCUMENTS 3,938,030 A * 2/1976 Cornwell .................. G05F 1/38
                                                       323/253
6,005,435 A   12/1999 Saida et al.
(Continued)

FOREIGN PATENT DOCUMENTS

CN    102291025 A    12/2011
CN    102 721 898    10/2012
(Continued)

OTHER PUBLICATIONS

International search report issued in PCT/EP2016/051544, dated Apr. 19, 2016.
(Continued)

*Primary Examiner* — Farhana A Hoque
(74) *Attorney, Agent, or Firm* — Mintz Levin Cohn Ferris Glovsky and Popeo, P.C.; Peter F. Corless; Steven M. Jensen

(57) ABSTRACT

To ascertain a parameter of a transformer (40) that has a high voltage side (41) and a low voltage side (43), a test signal generated by a source (13) is impressed on the low voltage side (43). A test response of the transformer (40) is recorded. A leakage reactance and/or a leakage inductance of the transformer (40) is determined by an evaluation device (18) of an apparatus (10) on the basis of the test response of the transformer (40).

12 Claims, 4 Drawing Sheets

(58) Field of Classification Search
USPC .................................................. 324/523, 547
See application file for complete search history.

(56) References Cited

U.S. PATENT DOCUMENTS

| | | | |
|---|---|---|---|
| 9,817,053 B2 | 11/2017 | Kruger et al. | |
| 2006/0114001 A1* | 6/2006 | Wang ................... | G01R 31/025 324/523 |
| 2012/0200233 A1 | 8/2012 | Pauritsch et al. | |
| 2014/0125351 A1 | 5/2014 | Woodward, Jr. et al. | |
| 2018/0024180 A1 | 1/2018 | Putter | |

FOREIGN PATENT DOCUMENTS

| | | | | |
|---|---|---|---|---|
| CN | 102 749 515 A | 10/2012 | | |
| CN | 102967763 A | 3/2013 | | |
| CN | 103063988 A | 4/2013 | | |
| EP | 2 466 322 A1 | 6/2012 | | |
| EP | 2 787 357 A1 | 10/2014 | | |
| EP | 2787357 | * 10/2014 | ............ | G01R 31/02 |
| EP | 3254124 A1 | 12/2017 | | |
| WO | 2016124443 A1 | 8/2016 | | |

OTHER PUBLICATIONS

Austrian Search Report cited on Application A 50092/2015, dated Jan. 25, 2016.
Office Action in corresponding Chinese Application No. 2016800085702 dated Apr. 3, 2019.
Examination search report dated May 23, 2018 in corresponding Canadian Application No. 2,975,007.

* cited by examiner

DEVICE AND METHOD FOR DETERMINING A PARAMETER OF A TRANSFORMER

This application is a national Phase application filed under 35 U.S.C. § 371 of PCT International Application No. PCT/EP2016/051544 with an International Filing Date of Jan. 26, 2016, which claims under 35 U.S.C. § 119(a) the benefit of Austrian Application No. A 50092/2015, filed Feb. 6, 2015, the entire contents of which are incorporated herein by reference.

FIELD OF THE INVENTION

Exemplary embodiments of the invention relate to an apparatus and a method for ascertaining at least one parameter of a transformer. Exemplary embodiments of the invention relate particularly to such apparatuses and methods as allow conclusions to be drawn about a reactance.

BACKGROUND

Transformers are used as parts of power supply systems. Transformers can be used for voltage conversion from a first value on a high voltage side to a second value which is lower than the first value, on a low voltage side.

Determining properties of a transformer using a transformer test that involves one or more characteristic parameters of the transformer being ascertained by measurement is necessary to ensure dependability, for actuation or for further reasons, for example. Examples of such measurements include not only determination of a static resistance or of a transformation ratio but also the determination of a leakage inductance or leakage reactance. On the basis of the leakage reactance, it is possible to identify deviations from the parameters of the transformer that are defined on a data sheet, which can be caused by deformation of a winding, for example.

There is a need for apparatuses and methods that can be used to efficiently ascertain at least one parameter of a transformer. There is a need for apparatuses and methods that allow automation of the ascertainment of such parameters.

SUMMARY OF THE INVENTION

According to exemplary embodiments, an apparatus and a method for ascertaining a parameter of a transformer are indicated that are set up to impress a test signal on a low voltage side of a transformer and to take a test response as a basis for ascertaining a leakage reactance and/or leakage inductance of the transformer.

An apparatus configured in this manner and a method configured in this manner provide greater flexibility for the ascertainment of parameters, since the test signal can be impressed on the low voltage side. The leakage reactance and/or the leakage inductance can be ascertained automatically. The leakage reactance and/or the leakage inductance can be ascertained without this necessarily requiring rewiring of the connections between the transformer test apparatus and the transformer.

The apparatus used to ascertain the parameter can comprise a controllable switching means that is used to short a high voltage side of the transformer while the test signal is impressed on the low voltage side. Automatic, sequential ascertainment of multiple parameters is facilitated thereby.

The source of the transformer test apparatus may be configured such that it is selectively operable as a current source or as a voltage source.

The controllable switching means may be a relay or can comprise a relay. The controllable switching means may be an insulated gate bipolar transistor (IGBT) or a field effect transistor (FET) or can comprise an IGBT or an FET.

An apparatus according to one exemplary embodiment is set up to ascertain a parameter of a transformer that has a high voltage side and a low voltage side. The apparatus comprises terminals for detachably connecting the apparatus to the low voltage side of the transformer. The apparatus comprises a source for generating a test signal, which source is coupled to the terminals in order to impress the test signal on the low voltage side of the transformer. The apparatus comprises an evaluation device that is set up to determine a leakage reactance and/or a leakage inductance of the transformer on the basis of a test response of the transformer.

The evaluation device can comprise at least one integrated semiconductor circuit that evaluates the test response.

The apparatus can comprise further terminals for detachably connecting the apparatus to the high voltage side of the transformer.

The apparatus can comprise a measuring device, coupled to the further terminals, for recording the test response. The measuring device can comprise a voltmeter.

The apparatus can comprise a controllable switching means, connected to the further terminals, for shorting the high voltage side.

The controllable switching means may be integrated in a housing of the apparatus. The controllable switching means may be a relay or another switch that is set up to switch a load circuit under the control of a control circuit. The controllable switching means may be an insulated gate bipolar transistor (IGBT) or a field effect transistor (FET) or can comprise an IGBT or an FET.

The apparatus may be set up to control the controllable switching means such that the high voltage side is shorted while the test signal is impressed on the low voltage side.

The evaluation device may be set up to determine the leakage reactance and/or the leakage inductance of the transformer on the basis of the test response and on the basis of a reactance and/or an inductance of at least one line that connects the further terminals to the high voltage side.

The evaluation device may be set up to determine the reactance and/or the inductance of the at least one line automatically.

The apparatus may be set up to determine the reactance and/or the inductance of the at least one line without rewiring between the apparatus and the transformer.

The evaluation device may be set up to determine from the test response a total reactance that is caused by the lines and the leakage reactance of the transformer, and to determine the leakage reactance from the total reactance and the reactance of the at least one line.

The evaluation device may be set up to determine a short-circuit impedance of the transformer on the basis of the test response of the transformer.

The evaluation device may be set up to determine the short-circuit impedance of the transformer on the basis of the test response and on the basis of an impedance of at least one line that connects the further terminals to the high voltage side.

The evaluation device may be set up to determine from the test response a total impedance that is caused by the lines and the leakage impedance of the transformer, and to determine the leakage impedance from the total impedance and the impedance of the at least one line.

The apparatus may be set up to determine a transmission factor of the transformer. The evaluation device may be set up to determine the leakage reactance on the basis of the transmission factor.

The apparatus can comprise a user interface. The evaluation device may be set up to ascertain the leakage reactance and/or the leakage inductance of the transformer as a response to an input on the user interface.

The user interface may be set up such that the user interface can be used to display an equivalent circuit diagram of the transformer. The user interface may be set up to use the user interface to depict the equivalent circuit diagram with an indication of the determined leakage reactance and/or of the leakage inductance.

The evaluation device may be set up to take the leakage reactance and/or the leakage inductance of the transformer as a basis for identifying deviations in relation to the nominal data of the transformer. The nominal data can be stored in nonvolatile fashion in a memory of the apparatus or can be retrieved from a remote memory by the apparatus automatically. Alternatively or additionally, the apparatus may be set up to use a user interface to receive the nominal data. The apparatus may be set up to retrieve the nominal data on the basis of a user input that indicates the type of the transformer, and to compare said nominal data with the ascertained leakage reactance and/or the leakage inductance of the transformer. The apparatus may be set up to take the comparison as a basis for outputting information about a discrepancy between the nominal data and the ascertained leakage reactance and/or the leakage inductance of the transformer.

The apparatus may be configured as a mobile transformer tester.

The apparatus may be configured as a portable transformer tester.

A system according to one exemplary embodiment comprises a transformer that has a high voltage side and a low voltage side. The system comprises an apparatus according to one exemplary embodiment that is connected to the transformer.

A method according to one exemplary embodiment is set up to ascertain a parameter of a transformer that has a high voltage side and a low voltage side. The method comprises impressing a test signal on the low voltage side. The method comprises recording a test response of the transformer. The method comprises determining a leakage reactance and/or a leakage inductance of the transformer on the basis of the test response of the transformer.

The test signal may be an AC signal or an AC voltage signal.

The method can be carried out by an apparatus that has terminals for detachable connection to the low voltage side of the transformer in order to impress the test signal and further terminals for detachably connecting the apparatus to the high voltage side of the transformer.

For the method, the apparatus can comprise a measuring device, coupled to the further terminals, for recording the test response. The measuring device can comprise a voltmeter.

The method can comprise shorting of the high voltage side by a controllable switching means of the apparatus.

For the method, the controllable switching means may be integrated in a housing of the apparatus. For the method, the controllable switching means may be a relay or another switch that is set up to switch a load circuit under the control of a control circuit. For the method, the controllable switching means may be an insulated gate bipolar transistor (IGBT) or a field effect transistor (FET) or can comprise an IGBT or an FET.

The method can comprise controlling the controllable switching means, so that the high voltage side is shorted while the test signal is impressed on the low voltage side.

The method can involve the leakage reactance and/or the leakage inductance of the transformer being determined on the basis of the test response and on the basis of a reactance and/or an inductance of at least one line that connects the further terminals to the high voltage side.

The method can involve the reactance and/or the inductance of lines between the apparatus and the transformer being automatically determined by the apparatus.

The method can involve the reactance and/or the inductance of the at least one line being determined without rewiring between the apparatus and the transformer.

The method can involve the apparatus determining from the test response a total reactance that is caused by the lines and the leakage reactance of the transformer. The method can involve the apparatus determining the leakage reactance from the total reactance and the reactance of the at least one line.

The method can involve the apparatus determining a short-circuit impedance of the transformer on the basis of the test response of the transformer.

The method can involve the apparatus determining the short-circuit impedance of the transformer on the basis of the test response and on the basis of an impedance of at least one line that connects the further terminals to the high voltage side.

The method can involve the apparatus determining from the test response a total impedance that is caused by the lines and the leakage impedance of the transformer.

The method can involve the apparatus determining the leakage impedance from the total impedance and the impedance of the at least one line.

The method can involve the apparatus determining a transmission factor of the transformer. The leakage reactance can be determined on the basis of the transmission factor, for example by converting primed transformer parameters into unprimed transformer parameters.

The method can involve the leakage reactance and/or the leakage inductance of the transformer being ascertained in response to an input on a user interface.

The method can involve the user interface being used to display an equivalent circuit diagram of the transformer. Optionally, an ascertained leakage reactance and/or leakage inductance can be depicted in the equivalent circuit diagram.

The method can involve the leakage reactance and/or the leakage inductance of the transformer being taken as a basis for identifying deviations from the nominal data of the transformer. The nominal data may be stored in nonvolatile fashion in a memory of the apparatus carrying out the check or can be retrieved from a remote memory by the apparatus automatically. Alternatively or additionally, a user interface can be used to receive the nominal data in order to allow the user to input the nominal data. The method can involve the nominal data being retrieved on the basis of a user input used to indicate the type of the transformer and being compared with the ascertained leakage reactance and/or the leakage inductance of the transformer. On the basis of the comparison, information about a discrepancy between the nominal data and the ascertained leakage reactance and/or the leakage inductance of the transformer can be output.

The apparatus used to carry out the method may be configured as a mobile transformer tester.

The apparatus used to carry out the method may be configured as a portable transformer tester.

The method can be carried out by the apparatus according to one exemplary embodiment.

Apparatuses, methods and systems according to exemplary embodiments allow efficient ascertainment of a leakage reactance and/or leakage inductance of a transformer. Apparatuses, methods and systems according to exemplary embodiments allow the ascertainment of additional parameters for a test without this requiring electrical lines between the apparatus and the test subject to be rewired. As a result, the test can be carried out more quickly. Apparatuses, methods and systems according to exemplary embodiments can be used to produce a low-impedance short circuit during at least part of a test, in order to achieve an uncorrupted test result.

BRIEF DESCRIPTION OF THE FIGURES

The invention is explained in more detail below on the basis of preferred embodiments with reference to the drawings. In the drawings, identical reference symbols denote identical elements.

DETAILED DESCRIPTION OF EXEMPLARY EMBODIMENTS

The present invention is explained in more detail below on the basis of preferred embodiments with reference to the drawings. In the figures, like reference symbols denote like or similar elements. The figures are schematic depictions of various embodiments of the invention. Elements depicted in the figures are not necessarily depicted to scale. Rather, the various elements depicted in the figures are reproduced such that their function and their purpose become comprehensible to the person skilled in the art.

Connections and couplings depicted in the figures between functional units and elements can also be implemented as an indirect connection or coupling. A connection or coupling may be implemented in wired or wireless form.

Apparatuses and methods for ascertaining a parameter of a transformer are described in detail below. The transformer may be a transformer for high or medium voltage networks. The transformer may be a transformer installed in a power station or substation. The apparatus may be a mobile appliance that allows the performance of the measurements on the installed transformer.

The apparatus is set up to ascertain a leakage reactance and/or leakage inductance of a transformer. To this end, a test signal, for example an alternating current, is supplied on the secondary side. The apparatus can record a test response. A phase of the test response relative to the test signal can be evaluated in order to ascertain the leakage inductance. The evaluation of the test response can be effected automatically by an evaluation device of the apparatus.

For apparatuses and methods, the reactance and/or inductance of at least one line between the apparatus and the transformer can be taken into consideration in order to ascertain the leakage reactance and/or the leakage inductance of the transformer. The test response can comprise, by way of example, a first recorded voltage and a second recorded voltage. From the magnitude and the phase of the first recorded voltage and the second recorded voltage, it is possible to determine both the reactance and/or the inductance of the line between the apparatus and the transformer and the leakage reactance and/or the leakage inductance of the transformer.

The apparatus can ascertain further parameters of the transformer automatically. By way of example, the apparatus may be set up to ascertain a transformation ratio of the transformer automatically. The transformation ratio can be used for computing the leakage reactance and/or the leakage inductance, for example in order to perform a conversion from what are known as primed parameters to unprimed parameters of the transformer. The corresponding computational processing can be performed automatically by the evaluation device of the apparatus.

Figure 1:
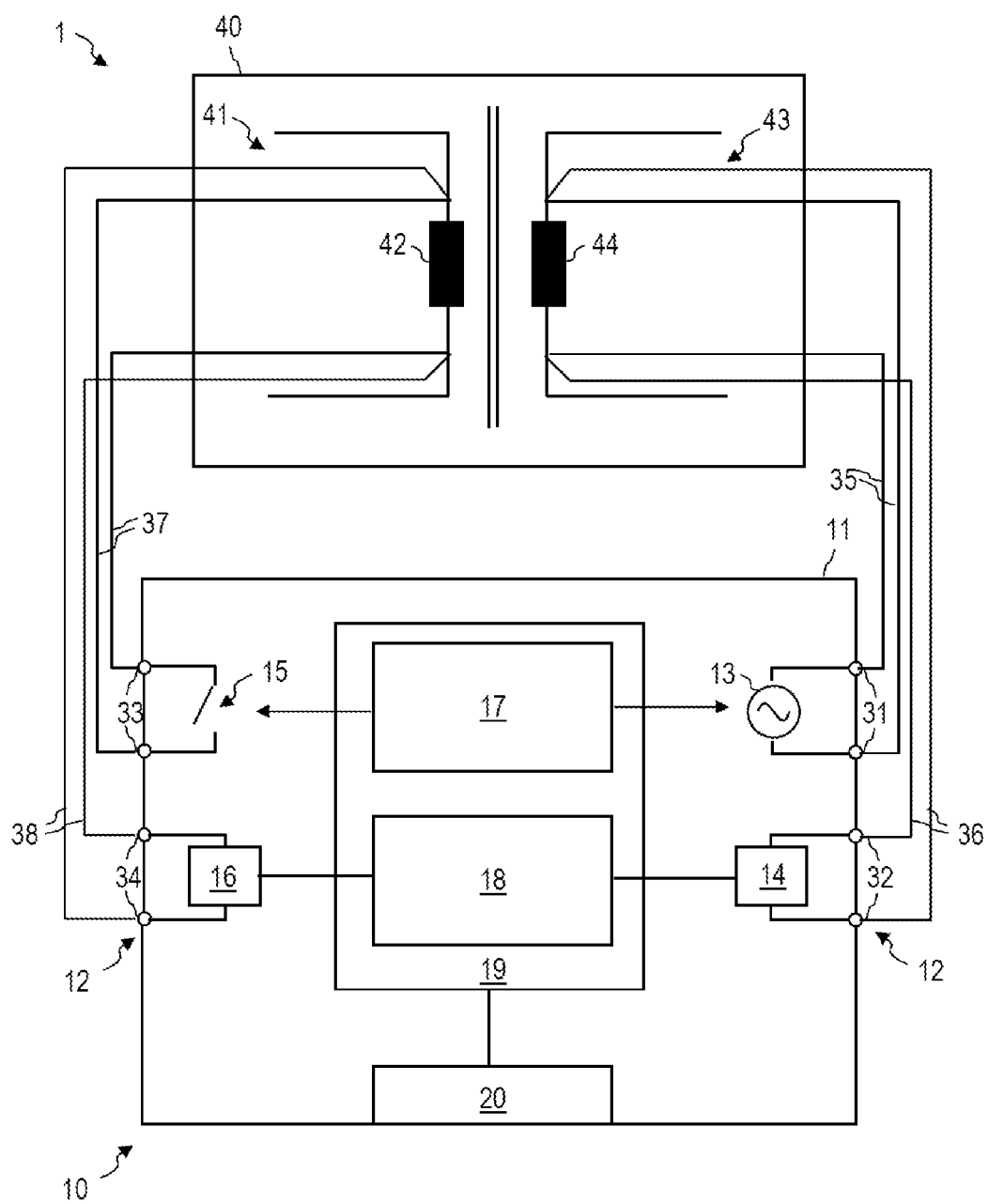
FIG. 1 shows a system having an apparatus according to one exemplary embodiment.

FIG. 1 shows a system 1 having an apparatus 10 for ascertaining a parameter of a transformer 40 according to one exemplary embodiment.

The system 1 comprises a transformer 40 and the apparatus 10. The apparatus 10 may be in the form of a single appliance having a housing 11. The apparatus 10 can consist of an arrangement of multiple appliances or devices. The multiple appliances or devices can in this case be controlled by a central controller. The apparatus 10 may be in the form of a mobile appliance and particularly in the form of a portable appliance. If the apparatus 10 consists of multiple appliances, then each of the appliances may be in the form of a portable appliance.

The transformer 40 may be a power transformer of an electric power supply device. The transformer 40 may be permanently installed in a power station or substation while the apparatus 10 is used to carry out a transformer test. The transformer 40 may be a voltage transformer or current transformer. The transformer 40 may be a voltage transformer or current transformer that operates on the basis of an inductive operating principle.

The transformer 40 comprises at least one first winding 42 and at least one second winding 44. The at least one first winding 42 may be provided on a high voltage side 41 of the transformer 40. The at least one second winding 44 may be provided on a low voltage side 43. The transformer 40 may optionally also have a tertiary winding.

The apparatus 10 comprises a plurality of terminals 12 for connection to the transformer 40, a source 13 for a test signal that is applied to or impressed on the transformer 40 as test subject during the transformer test and an evaluation device 18. One or more measuring devices 14, 16 for recording a test response of the transformer 40 may be integrated in the apparatus 10.

The plurality of terminals 12 comprises terminals 31 that are set up for coupling to the low voltage winding 44 of the transformer 40. The source 13 is coupled to the terminals 31 in order to impress the test signal on the low voltage side 43. The plurality of terminals 12 comprises further terminals 33, 34 that are set up for coupling to the high voltage winding. The measuring device 14 may be connected to the low voltage side 43 via lines 36. The measuring device 16 may be connected to the high voltage side 41 via lines 38. The connection between the apparatus 10 and the transformer 40 may be detachable in order to allow ascertainment of parameters during field use.

The evaluation device 18 is set up to evaluate the test response of the transformer 40 in order to determine a leakage reactance and/or a leakage inductance of the transformer 40, as described in even more detail below.

The source 13 may be a current source that is controllable in order to generate an alternating current as a test signal. The source 13 may be controllable in order to generate alternating currents at multiple different frequencies as a test signal. The source 13 may also be a voltage source. The source 13 may be operable in different modes of operation, for example as a current source or as a voltage source and/or as a source of a signal that is constant over time or of an AC signal. The test signal generated by the source 13 can be impressed on the low voltage side 43 via the terminals 13 and the lines 35.

The apparatus 10 can comprise further devices. The apparatus 10 can comprise a control device 17 for the automatic electrical control of the source 13. The first measuring device 14 and the second measuring device 16 may be set up for a voltage measurement, for example. The functions of the control device 17 and/or of the evaluation device 18 can be carried out by a processor 19 or another integrated semiconductor circuit 19.

The apparatus 10 can comprise a controllable switching means 15. The controllable switching means 15 may be set up to selectively short the high voltage winding 42. In this way, the test response of the transformer can be recorded for a short circuit on the high voltage side 41. It is also possible to record the test response both for a short circuit on the high voltage side 41 and during idling for an open switch 15. The controllable switching means 15 can be actuated by the control device 18 automatically. The controllable switching means 15 may be conductively connected to the high voltage winding 42 via further terminals 33 and lines 37 between the further terminals 33 and the high voltage winding 42. The controllable switching means 15 may be a conventional switch, a mechanical/electrical switch, a relay, an FET, an IGBT or another component that is suitable for making an electrically conductive connection between the terminals 33 on the basis of a state of the switching means 15.

The apparatus 10 can determine the leakage reactance and/or leakage inductance of the transformer 40 in different ways. By way of example, the control device 17 can control the source 13 such that the test signal is impressed on the low voltage side 43. The test signal may be an AC signal. It is possible for sequentially different frequencies of the AC signal to be set on a user-defined basis or automatically.

The apparatus 10 can ascertain the amplitude and phase of a test response of the transformer 40. By way of example, a measuring device 14 can be used to record a voltage on the low voltage side 43 as a first test response. A further measuring device 16 can be used to record a voltage on the high voltage side 41 as a second test response. The apparatus 10 can determine the phase of both the first test response and the second test response relative to the test signal of the source 13. This can be carried out in different ways. By way of example, a time interval between zero crossings in the test signal and in the test responses can be identified. A time interval between a zero crossing of the test signal and a zero crossing of the reference signal can be determined, and it is possible for further time intervals between a zero crossing in each of the test responses and the reference signal to be determined. The time intervals and the frequency of the reference signal can be used to determine the phase. Alternatively or additionally, multiplication of the test signal and the test response in combination with averaging over time can be used in order to determine the phase from the average over time and the amplitudes of the multiplied signals.

The apparatus 10 can determine the amplitude of one or more test responses automatically. The evaluation device 18 can compute a quotient from the amplitude of a test response and the test signal amplitude.

The evaluation device 18 can determine the total series reactance of the transformer from the phase shift in the first test response relative to the test signal, the phase shift of the second test response relative to the test signal and the amplitudes of the first and second test responses. The evaluation device 18 can ascertain the total series reactance as a primed parameter of the transformer 40. The evaluation device 18 may optionally be set up to determine the total series reactance as an unprimed parameter by means of scaling with the square of the transformation ratio of the transformer 40.

Figure 4:
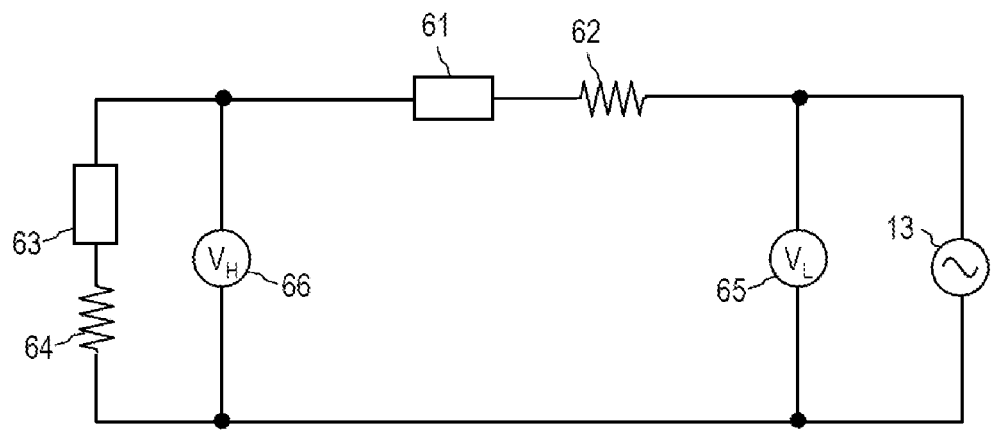
FIG. 4 shows an equivalent circuit diagram of a transformer to explain the operation of the apparatus according to one exemplary embodiment.

In one configuration, as described in even more detail with reference to FIG. 4, the evaluation device 18 may be set up to determine a total impedance, which is the sum of the series impedance of the transformer and the impedance of the lines 37, from the phase and amplitude of the voltage recorded using the evaluation device 14. The evaluation device 18 may be set up to determine the impedance of the lines 37 from the phase and amplitude of the voltage recorded using the evaluation device 16. The evaluation device 18 may be set up to determine the total series reactance of the transformer 40 as the difference between the imaginary part of the total impedance and the imaginary part of the impedance of the lines 37. The evaluation device 18 may be set up to convert the total series reactance determined in this manner into an unprimed parameter of the transformer by means of scaling with the square of the transformation ratio.

In a further configuration, the evaluation device 18 may be set up to determine the total series reactance of the transformer 40 from the total impedance and the total resistance. The total resistance can be ascertained by means of a static resistance measurement or by means of evaluation of the first and second test response.

The evaluation device 18 may be set up to ascertain the total leakage inductance of the transformer 40. To this end, the evaluation device 18 can divide the leakage reactance by the angular frequency of the test signal.

The apparatus 10 may be set up to determine the transformation ratio of the transformer 40 automatically and to take it into consideration as an unprimed parameter when computing the leakage reactance or leakage inductance. By way of example, to this end, the source 13 can be operated as an AC voltage source and the voltage on the high voltage side 41 can be recorded in order to determine the transformation ratio of the transformer. Other techniques can be used to determine the transformation ratio.

The apparatus 10 can comprise a user interface 20. The user interface 20 may be a graphical user interface 20 that is set up to allow user-defined stipulation of measurements that are carried out by the apparatus 10. The source 13 and/or the controllable switching means 15 can be operated in time-dependent fashion in order to determine the leakage reactance and/or the leakage inductance of the transformer 40.

The apparatus 10 may be set up such that different measurements can be effected without the connections 35-38 between the apparatus 10 and the transformer 40 having to be broken and/or connected differently. The different measurements can be carried out without the need for the test subject to be rewired. The measurements can be performed by the apparatus 10 in fully or partly automated fashion, i.e. without the interaction of the user between the measurements. In this way, it is possible both to determine the leakage reactance and/or the leakage inductance of the transformer 40 and to record at least one further parameter, for example a dynamic or static resistance.

The apparatus 10 may be set up to carry out the multiple different measurements sequentially, the measurements and optionally also their order being able to be stipulated on a user-defined basis via the interface 20. The interface 20 can be used to depict an equivalent circuit diagram of the transformer 40, for example, in which the user can select which parameters are to be measured. Alternatively or additionally, the evaluation device 18 can control the interface 20 such that an equivalent circuit diagram of the transformer 40 is depicted in which the determined leakage reactance and/or leakage inductance of the transformer 40 is indicated.

While FIG. 1 depicts an apparatus 10 for which the controllable switching means 15 is integrated in the apparatus 10, the determination of the leakage reactance and/or the leakage inductance of the transformer 40 can also be effected when the apparatus 10 has no controllable switching means for shorting the high voltage side 41.

The apparatus 10 may be set up to carry out further processing steps on the basis of the determined leakage reactance and/or leakage inductance. By way of example, the apparatus 10 may be set up to identify deviations from the nominal data of the transformer 40. The nominal data may be stored in nonvolatile fashion in the memory of the apparatus 10. The nominal data can be retrieved from a remote memory by the apparatus 10 automatically, for example via a wireless or wired wide area network or a local area network. Alternatively or additionally, the apparatus 10 may be set up to receive the nominal data via the interface 20. The apparatus 10 may be set up to retrieve the nominal data on the basis of a user input used to indicate the type of the transformer, and to compare said nominal data with the ascertained leakage reactance and/or the leakage inductance of the transformer 40. The apparatus 10 may be set up to take the comparison as a basis for outputting information about a discrepancy between the nominal data and the ascertained leakage reactance and/or the leakage inductance of the transformer 40.

Figure 2:
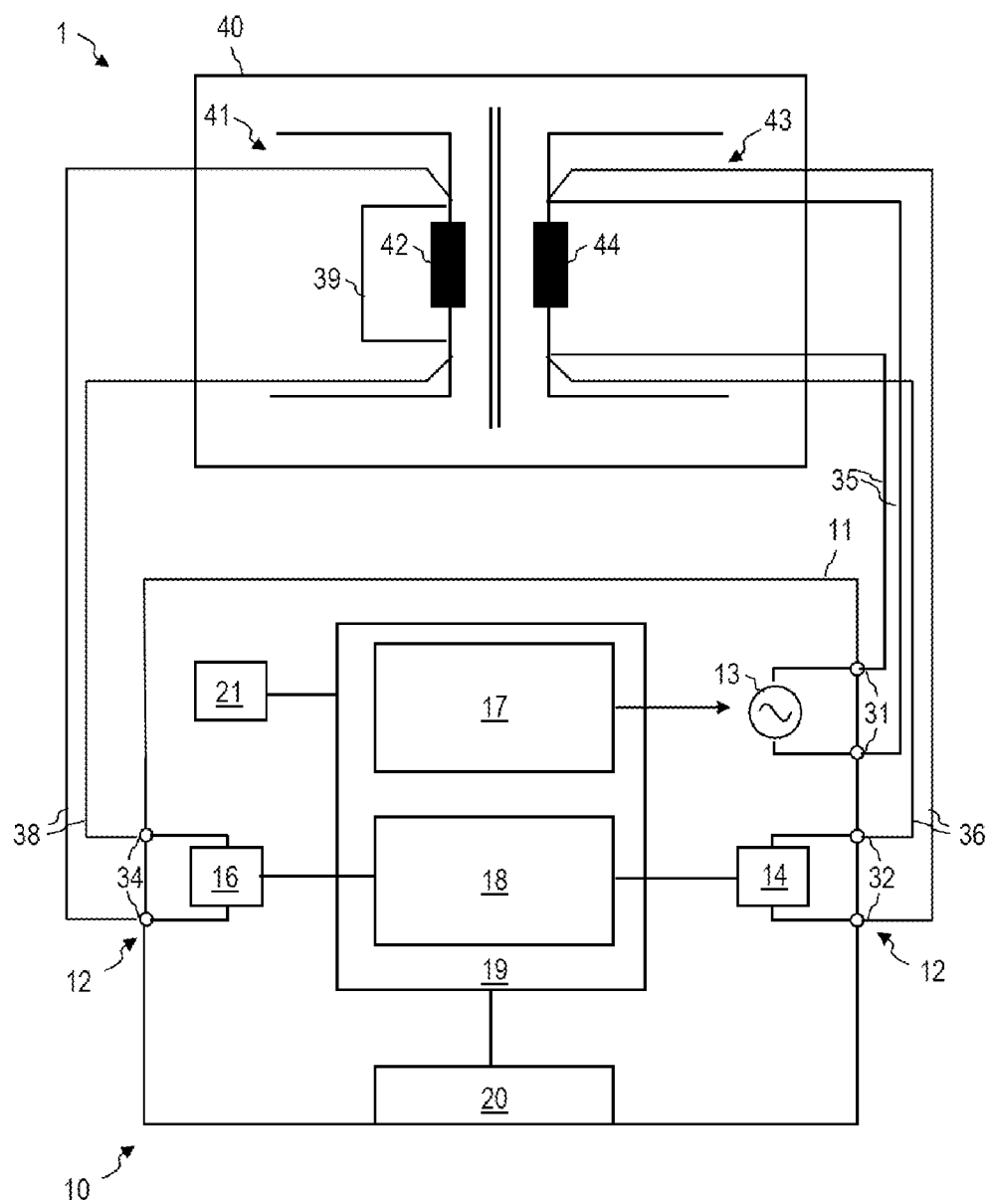
FIG. 2 shows a system having an apparatus according to one exemplary embodiment.

FIG. 2 is a depiction of a system 1 having an apparatus 10 according to a further exemplary embodiment. The apparatus 10 can, but does not have to, have no controllable switching means 15 for shorting the high voltage side 41. To determine the leakage reactance and/or leakage inductance, the high voltage winding 42 can be shorted to a line 39, so that the short circuit is not routed via the apparatus 10.

The further configuration and operation of the apparatus 10 may be as described with reference to the apparatus 10 of FIG. 1.

The apparatus 10 can comprise a reference signal source 21. The reference signal source 21 can generate a sinusoidal or other AC signal at a frequency that corresponds to the frequency of the test signal generated by the source 13. The evaluation device 18 can ascertain a phase shift or a time offset between test response and test signal by determining the phase of the test signal relative to the reference signal of the reference signal source 21 and by determining the phase of the test response relative to the reference signal of the reference signal source 21.

Figure 3:
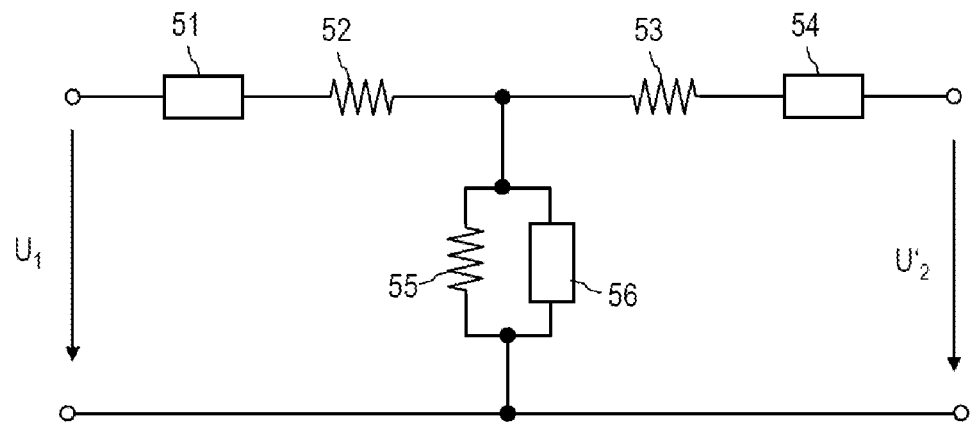
FIG. 3 shows an equivalent circuit diagram of a transformer to explain the operation of the apparatus according to one exemplary embodiment.

FIG. 3 and FIG. 4 show equivalent circuit diagrams to explain the operation of the apparatus according to one exemplary embodiment.

FIG. 3 shows an equivalent circuit diagram of the transformer 40. The winding resistance $R_1$ of the high voltage side 41 can be represented by a resistor 51. The transformed winding resistance $R_2'$ of the low voltage side 43 can be represented by a resistor 54. The leakage inductance $L_{o1}$ of the high voltage side 41 can be represented by an inductance 52. The transformed leakage inductance $L_{o2}'$ of the low voltage side 43 can be represented by an inductance 53. The resistances 51, 54 and inductances 52, 53 define the total series inductance of the transformer. The inductances 52, 53 define the untransformed, i.e. unprimed, total leakage inductance, which can be converted into a primed parameter of the transformer by means of scaling with the square of the transformation ratio in a manner that is known per se.

A main inductance carrying the magnetization current can be taken into consideration by an inductance 55. Linear modeling of losses in the transformer core can be provided by a resistor 56.

The apparatus according to one exemplary embodiment is set up to impress the test signal on the low voltage side and to take the test response as a basis for determining at least the total series reactance and/or the total leakage inductance of the transformer 40.

FIG. 4 shows an equivalent circuit diagram to further explain the operation of the apparatus 10 according to exemplary embodiments.

The apparatus 10 can supply the test signal of the source 13 on the low voltage side of the transformer. A voltmeter 65 or another voltage measuring device can record a voltage $V_L$ on the low voltage side as a first test response. A voltmeter 66 or another voltage measuring device can record a voltage $V_H$ on the high voltage side as a second test response. The first and second test responses can be evaluated as described above, for example, in order to determine the leakage reactance and/or the leakage inductance of the transformer 40.

FIG. 4 depicts the total transformed series impedance by means of the resistor 61 and the inductance 62. The lines 37 between the apparatus 10 and the transformer 40 have a line impedance to which a line resistance 63 and a line inductance 64 can contribute.

By evaluating the phase and amplitude of the voltage $V_H$ on the high voltage side relative to the test signal and by evaluating the phase and amplitude of the voltage $V_L$ on the low voltage side relative to the test signal, it is possible to ascertain the total transformed series resistance 61 and the total transformed series reactance, which is proportional to the total transformed leakage inductance 62. By way of example, the total impedance can be ascertained from the phase and amplitude of the voltage $V_H$ on the high voltage side relative to the test signal. The line impedance can be ascertained from the phase and amplitude of the voltage $V_H$ on the high voltage side relative to the test signal. The transformed leakage reactance can be determined as the difference between the imaginary parts of the total impedance and the line impedance. Scaling with the square of the transformation ratio allows the leakage reactance to be determined as an unprimed parameter of the transformer.

The evaluation and computation steps for determining the leakage reactance can be carried out by the evaluation device 18 automatically.

Figure 5:
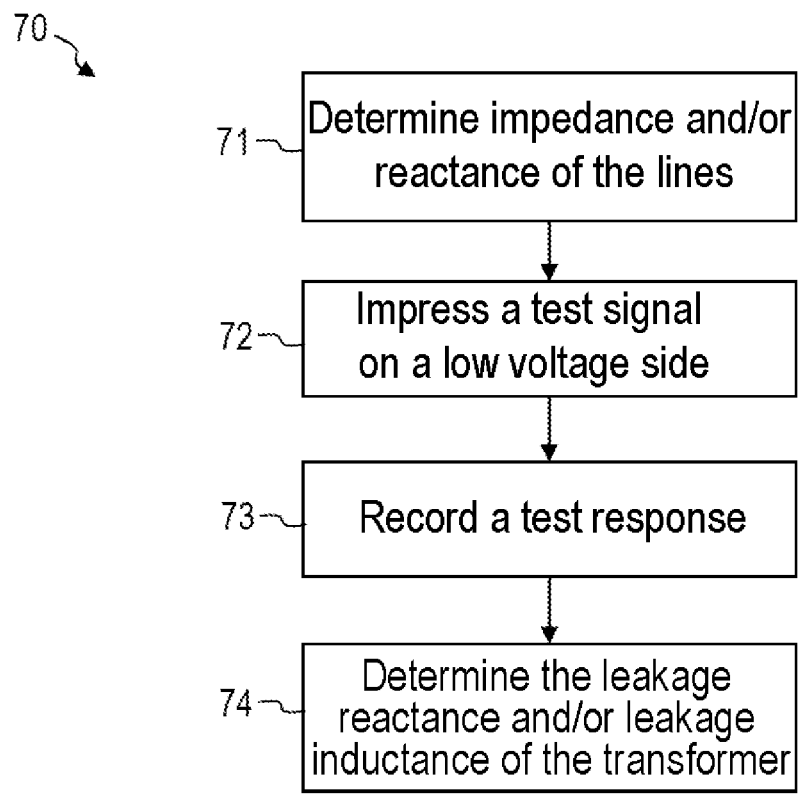
FIG. 5 is a flowchart for a method according to one exemplary embodiment.

FIG. 5 is a flowchart for a method 70 according to one exemplary embodiment. The method 70 can be carried out by the apparatus 10 according to one exemplary embodiment automatically.

In step 71, a line impedance and/or line reactance of at least one line between the apparatus 10 and the transformer 40 can be ascertained. To this end, the source 13 can generate a test signal.

In step 72, a test signal generated by the source 13 is impressed on the low voltage side of the transformer 40. The test signal may be an AC signal.

In step 73, a test response of the transformer can be recorded. The test response can comprise an AC voltage across a high voltage winding and a further AC voltage across a low voltage winding, which are recorded on a time-dependent basis.

In step 74, the leakage reactance and/or the leakage inductance of the transformer 40 are determined. The determined leakage reactance and/or leakage inductance can correspond to the total series reactance and the total leakage inductance of the transformer.

The method 70 can contain further steps. By way of example, a transformation ratio can be automatically determined. The transformation ratio can be used to convert transformed parameters into untransformed parameters.

The method 70 can comprise the evaluation of a user input that is used to stipulate, on a user-defined basis, which parameters of the transformer 40 are determined.

The method 70 can comprise the actuation of a graphical user interface such that the ascertained leakage reactance and/or leakage inductance is depicted.

While exemplary embodiments have been described in detail with reference to the figures, further exemplary embodiments can involve alternative or additional features being used. While, by way of example, particular processing steps for ascertaining the leakage reactance and/or leakage inductance have been described by way of example, other processing techniques can be used. By way of example, the leakage reactance and/or the leakage inductance can be ascertained by resolving a matrix equation system into elements of a mapping matrix that maps the sinusoidal and cosinusoidal components of the test signal into corresponding components of one or more test responses.

While exemplary embodiments can involve the apparatus comprising a controllable switching means for shorting a winding of the transformer, it can also have two or more than two controllable switching means for shorting multiple windings of the transformer or no such controllable switching means. The apparatus may be set up to short multiple windings simultaneously or at sequential times.

While exemplary embodiments can involve a procedure that includes the determination of multiple parameters of the transformer being carried out automatically, the apparatus and the method according to exemplary embodiments can also be used when only one parameter of the transformer, for example only the leakage reactance, is measured before a new user input is required.

While the transformer may be installed in a power station or substation of a power supply system, the apparatus and the method according to exemplary embodiments can also be used for smaller transformers.

Apparatuses, methods and systems according to exemplary embodiments allow ascertainment of parameters such as leakage reactance and/or leakage inductance with a more extensive automation for the transformer test.

The invention claimed is:

1. An apparatus for ascertaining a parameter of a transformer that has a high voltage side and a low voltage side, wherein the apparatus comprises:
   terminals for detachably connecting the apparatus to the low voltage side of the transformer;
   further terminals for detachably connecting the apparatus to the high voltage side of the transformer;
   a controllable switching device, connected to the further terminals, for shorting the high voltage side of the transformer;
   a source for generating a test signal, which source is connected to the terminals in order to impress the test signal on the low voltage side of the transformer;
   a control device for automatically controlling the source and the controllable switching device such that the high voltage side is shorted while the test signal is impressed by the source on the low voltage side; and
   an evaluation device that is set up to determine a leakage reactance or a leakage inductance of the transformer on the basis of a test response of the transformer recorded while the high voltage side is shorted by the controllable switching device and the test signal is impressed by the source on the low voltage side.

2. The apparatus as claimed in claim 1, further comprising:
   a measuring device, coupled to the further terminals, for recording the test response.

3. The apparatus as claimed in claim 1,
   wherein the evaluation device is set up to determine the leakage reactance or the leakage inductance of the transformer on the basis of the test response and on the basis of a reactance or an inductance of at least one line that connects the further terminals to the high voltage side.

4. The apparatus as claimed in claim 3,
   wherein the evaluation device is set up to determine the reactance or the inductance of the at least one line automatically.

5. The apparatus as claimed in claim 3,
   wherein the apparatus is set up to determine the reactance or the inductance of the at least one line without rewiring between the apparatus and the transformer.

6. The apparatus as claimed in claim 1,
   wherein the evaluation device is additionally set up to determine a short-circuit impedance of the transformer on the basis of the test response of the transformer.

7. The apparatus as claimed in claim 6,
   wherein the evaluation device is set up to determine the short-circuit impedance of the transformer on the basis of the test response and on the basis of an impedance of at least one line that connects the further terminals to the high voltage side.

8. The apparatus as claimed in claim 1, further comprising:
   a user interface,
   wherein the evaluation device is set up to ascertain the leakage reactance or the leakage inductance of the transformer as a response to an input on the user interface.

9. The apparatus as claimed in claim 1,
   wherein the evaluation device is set up to take the leakage reactance or the leakage inductance of the transformer as a basis for automatically identifying deviation from nominal data of the transformer.

10. A system, comprising:
a transformer that has a high voltage side and a low voltage side, and
an apparatus as claimed in claim 1 that is connected to the transformer.

11. A method for ascertaining a parameter of a transformer that has a high voltage side and a low voltage side, comprising:
automatically shorting the high voltage side of the transformer using a controllable switching device,
automatically impressing a test signal on the low voltage side while the high voltage side is shorted;
recording a test response of the transformer while the test signal is impressed on the low voltage side and the high voltage side is shorted by the controllable switching device; and
determining a leakage reactance or a leakage inductance of the transformer on the basis of the test response of the transformer.

12. The method as claimed in claim 11,
which is carried out using an apparatus including:
terminals for detachably connecting the apparatus to the low voltage side of the transformer;
further terminals for detachably connecting the apparatus to the high voltage side of the transformer;
the controllable switching device, connected to the further terminals, for shorting the high voltage side of the transformer;
a source for generating the test signal, which source is connected to the terminals in order to impress the test signal on the low voltage side of the transformer;
a control device for automatically controlling the source and the controllable switching device such that the high voltage side is shorted while the test signal is impressed by the source on the low voltage side; and
an evaluation device that is set up to determine the leakage reactance or the leakage inductance of the transformer on the basis of the test response of the transformer recorded while the high voltage side is shorted by the controllable switching device and the test signal is impressed by the source on the low voltage side.

* * * * *